United States Patent
Yates

(10) Patent No.: US 6,656,372 B2
(45) Date of Patent: Dec. 2, 2003

(54) METHODS OF MAKING MAGNETORESISTIVE MEMORY DEVICES

(75) Inventor: Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 09/971,758

(22) Filed: Oct. 4, 2001

(65) Prior Publication Data

US 2003/0068897 A1 Apr. 10, 2003

(51) Int. Cl.[7] ................................................. G11B 5/127
(52) U.S. Cl. ............................ 216/22; 216/38; 216/41; 216/67; 216/75; 216/88; 216/100; 204/192.34
(58) Field of Search ............................. 216/22, 38, 41, 216/67, 72, 75, 88, 100; 438/3, 692, 696, 720, 754; 204/192.34

(56) References Cited

U.S. PATENT DOCUMENTS

| | | | | |
|---|---|---|---|---|
| 4,396,479 A | * | 8/1983 | Jones | 204/192.32 |
| 4,528,066 A | * | 7/1985 | Merkling et al. | 438/696 |
| 5,100,505 A | * | 3/1992 | Cathey, Jr. | 438/695 |
| 5,393,376 A | * | 2/1995 | Chen et al. | 216/22 |
| 5,438,747 A | * | 8/1995 | Krounbi et al. | 29/603.16 |
| 5,607,599 A | * | 3/1997 | Ichihara et al. | 216/22 |
| 5,867,890 A | * | 2/1999 | Hsiao et al. | 29/603.14 |
| 6,024,885 A | * | 2/2000 | Pendharkar et al. | 216/22 |
| 6,261,468 B1 | * | 7/2001 | Sato et al. | 216/22 |
| 6,315,875 B1 | * | 11/2001 | Sasaki | 204/192.34 |
| 6,426,012 B1 | * | 7/2002 | O'Sullivan et al. | 216/22 |

OTHER PUBLICATIONS

"Silicon Processing For The VLSI Era"; Wolff; pp. 666–667, 1992.
"Ion Beam Etching (Ion Milling)"; Website: http://inst-i.physics.sunysb.edu/~zheng/research/ion_milling.html;pp. 1–2, 8/01.
"Ion Mill"; PETS Inc., Product 5;Website: http://pleqtecser-.com/prod05.htm;pp. 1–2, 8/01.
"Products"; PETS Inc., Products Page; Website: http://pleqtecser.com/products.htm;pp. 1–2, 8/01.

* cited by examiner

*Primary Examiner*—Anita Alanko
(74) *Attorney, Agent, or Firm*—Wells St. John P.S.

(57) ABSTRACT

The invention includes methods of forming magnetoresistive devices. In one method, a construction is formed which includes a first magnetic layer, a non-magnetic layer over the first magnetic layer, and a second magnetic layer over the non-magnetic layer. A first pattern is extended through the second magnetic layer and to the non-magnetic layer with an etch selective for the material of the second magnetic layer relative to the material of the non-magnetic layer. A dielectric material is formed over the patterned second magnetic layer, and subsequently a second etch is utilized to extend a second pattern through the non-magnetic layer and at least partway into the first magnetic layer.

43 Claims, 5 Drawing Sheets

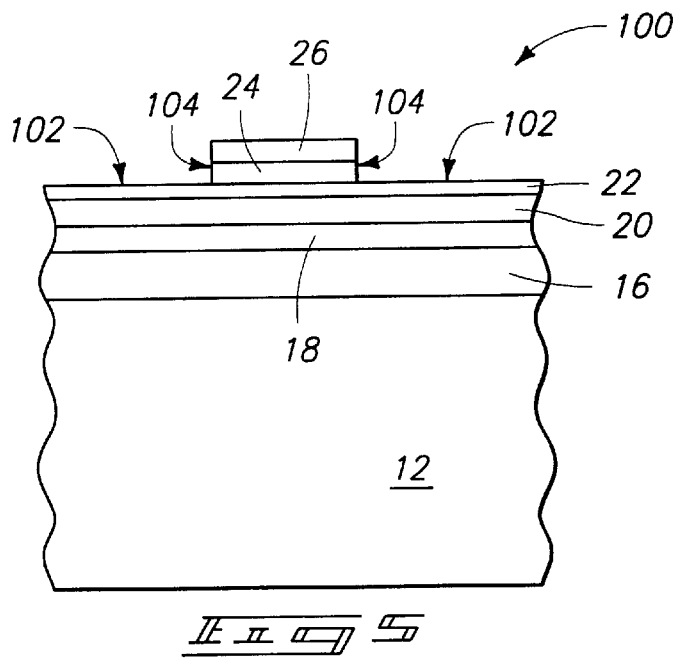
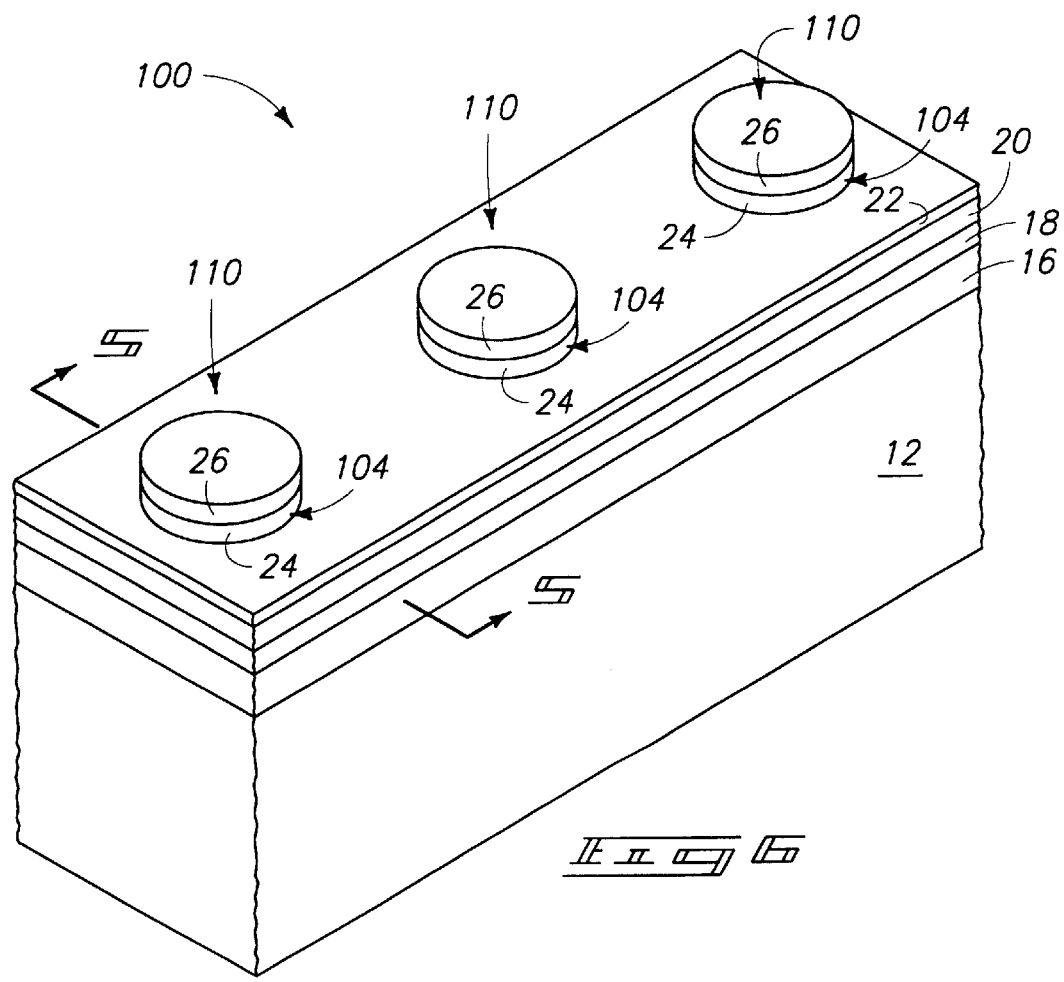

METHODS OF MAKING MAGNETORESISTIVE MEMORY DEVICES

TECHNICAL FIELD

The invention pertains to methods of making magnetoresistive memory devices, such as, for example, magnetic random access memory (MRAM) devices.

BACKGROUND OF THE INVENTION

Numerous types of digital memories are utilized in computer system components, digital processing systems, and other applications for storing and retrieving data. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the memory devices. It is noted that the term "magnetoresistive device" characterizes the device and not the access method, and accordingly a magnetoresistive device can be accessed by, for example, either inductive sensing or magnetoresistive sensing methodologies.

A significant amount of research is currently being invested in magnetic digital memories, such as, for example, MRAMs, because such memories are seen to have significant potential advantages relative to the dynamic random access memory (DRAM) components and static random access memory (SRAM) components that are presently in widespread use. For instance, a problem with DRAM is that it relies on power storage within capacitors. Such capacitors leak energy, and must be refreshed at approximately 15 nanosecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, MRAM devices do not require constant refreshing, but instead store data in stable magnetic states. Further, the data stored in MRAM devices can potentially remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed.

Exemplary problems associated with prior art processing are described with reference to FIGS. 1 and 2. FIG. 1 illustrates a wafer fragment 10 comprising a semiconductor substrate 12. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A stack 14 is provided over substrate 12, and will ultimately be utilized to form an MRAM device. Stack 14 comprises a conductive material 16, a first barrier layer 18, a first magnetic material 20, a non-magnetic material 22, a second magnetic material 24, and a second barrier layer 26. It is noted that the shown layers are those pertinent to the present invention, and that the layers can be formed physically against one another as shown, or other layers (not shown) can be provided between various of the shown layers in forming an MRAM construction.

Conductive material 16 can comprise, for example, either elemental copper or copper alloys.

Layers 18 and 26 are referred to as barrier layers to indicate that layers 18 and 26 can impede diffusional exchange of materials across the layers. Layers 18 and 26 can alternatively be referred to as spacer layers, or as anti-magnetic layers. Layers 18 and 26 can comprise, for example, elemental tantalum or tantalum nitride (TaN). Layers 18 and 26 can comprise other components in addition to, or alternatively to, tantalum-containing components, such as, for example, Ti, W, TiN, SiN, or $SiO_2$. Layers 18 and 26 can comprise the same compositions as one another, or different compositions.

Magnetic layers 20 and 24 can comprise, for example, one or more of nickel, iron, cobalt, iridium, platinum, ruthenium, and manganese. Layers 20 and 24 can comprise the same compositions as one another, or different compositions. After layers 20 and 24 are incorporated into an MRAM device, one of the magnetic layers 20 and 24 will typically be referred to as a sense layer and the other will be referred to as a reference or pinned layer. Another magnetic layer (not shown) can be provided proximate the reference layer to pin the layer into a particular magnetic orientation.

Non-magnetic layer 22 can comprise either an electrically conductive material (for example, in applications in which the resultant MRAM is to be a giant magnetoresistive (GMR) device), or alternatively can comprise electrically insulative material (for example, in applications in which a resulting MRAM device is to be a tunnel magnetoresistive (TMR) device). Exemplary conductive materials which can be utilized for non-magnetic layer 22 are copper and copper alloys; and exemplary insulative materials which can be utilized for non-magnetic layer 22 are aluminum oxide ($Al_2O_3$), silicon oxynitride ($Si_xN_yO_z$, wherein x, y and z are greater than 0) and silicon dioxide ($SiO_2$).

A masking block 30 is shown formed over stack 14. Masking block 30 can comprise photoresist, and can be formed utilizing photolithographic patterning methodologies. Block 30 can further comprise a so-called hard mask alternatively to, or in addition to, a photoresist block. The block 30 is in a shape comprising a desired peripheral pattern. The peripheral pattern is defined by the location of sidewall peripheries 32 and 34 of the masking block.

Referring to FIG. 2, the peripheral pattern of block 30 is transferred to underlying layers 18, 20, 22, 24 and 26 with a suitable etch to extend the peripheral pattern of block 30 through layers 18, 20, 22, 24 and 26. The etched layers 18, 20, 22, 24 and 26 define an MRAM construction 50. The etch utilized for etching through layers 18, 20, 22, 24 and 26 can comprise a primarily physical etch (as opposed to a primarily chemical etching process), such as, for example, ion milling or some of the reactive ion etching processes.

The etching of layers 18, 20, 22, 24 and 26 forms sputtered material 40 as a reaction by-product, and some of the sputtered material deposits on sidewalls of the patterned layers. Sputtered material 40 comprises magnetic components from layers 20 and 24, and accordingly can magnetically interconnect layers 20 and 24 across an outer sidewall of non-magnetic layer 22. Such magnetic interconnection of layers 20 and 24 can render a resultant MRAM device comprising layers 20 and 24 inoperative. Specifically, it is desired that layers 20 and 24 be isolated from one another during operation of an MRAM device. As indicated above, one of magnetic layers 20 and 24 will typically be referred to as a sense layer, and the other of the layers will be referred to as a reference or pinned layer. In operation, information is stored in an MRAM device as a magnetic orientation within layer 24 relative to the magnetic orientation within layer 20. Specifically, if layer 24 has an antiparallel magnetic orientation relative to layer 20, such would correspond to a first memory state, and if layer 24 has a parallel magnetic orientation relative to layer 20 such corresponds to a second memory state. If, however, magnetic layer 24 is magnetically connected to layer 20 through magnetic materials across the sidewall of layer 22, magnetic information from layer 24 can propagate to magnetic layer 20, and vice versa; rendering it difficult, or even impossible, to store information in a device comprising layers 20 and 24.

Another problem associated with the MRAM device 50 of FIG. 2 can be that the layers 18, 20 and 22 are patterned into a same configuration as the layers 24 and 26. In particular applications, it can be desired to have layers 24 and 26 patterned into a different configuration than layers 18, 20 and 22.

It would be desirable to develop new methods for forming MRAM devices which overcome some or all of the above-discussed problems.

SUMMARY OF THE INVENTION

In one aspect, the invention encompasses a method of forming a magnetoresistive device. A construction is formed which includes a first magnetic layer, a non-magnetic layer over the first magnetic layer, and a second magnetic layer over the non-magnetic layer. A first pattern is extended through the second magnetic layer and to the non-magnetic layer with an etch selective for the material of the second magnetic layer relative to the material of the non-magnetic layer. A dielectric material is formed over the patterned second magnetic layer, and subsequently a second etch is utilized to extend a second pattern through the non-magnetic layer and at least partway into the first magnetic layer.

In another aspect, the invention encompasses a method wherein a stack comprising a first magnetic layer, a second magnetic layer, and a non-magnetic layer is formed. The non-magnetic layer is between the first and second magnetic layers. A patterned mask is formed over the second magnetic layer, and defines a first pattern. The first pattern is extended into the second magnetic layer, but not entirely through the second magnetic layer, with a first etch. A second etch is then utilized to extend the first pattern entirely through the second magnetic layer and to the non-magnetic layer. The second etch is selective for the material of the second magnetic layer relative to the material of the non-magnetic layer. A dielectric material is formed over the patterned second magnetic layer, and subsequently a third etching process is utilized to extend a second pattern through the non-magnetic layer and first magnetic layer.

BRIEF DESCRIPTION OF THE DRAWINGS

Preferred embodiments of the invention are described below with reference to the following accompanying drawings.

FIG. 5 is a view of the FIG. 3 wafer fragment shown at a processing step subsequent to that of FIG. 4.

FIG. 6 is a diagrammatic isometric view of a portion of the semiconductor wafer comprising the FIG. 5 cross-section. The FIG. 5 cross-section extends through the line 5—5 of FIG. 6.

DETAILED DESCRIPTION OF THE PREFERRED EMBODIMENTS

Figure 1:
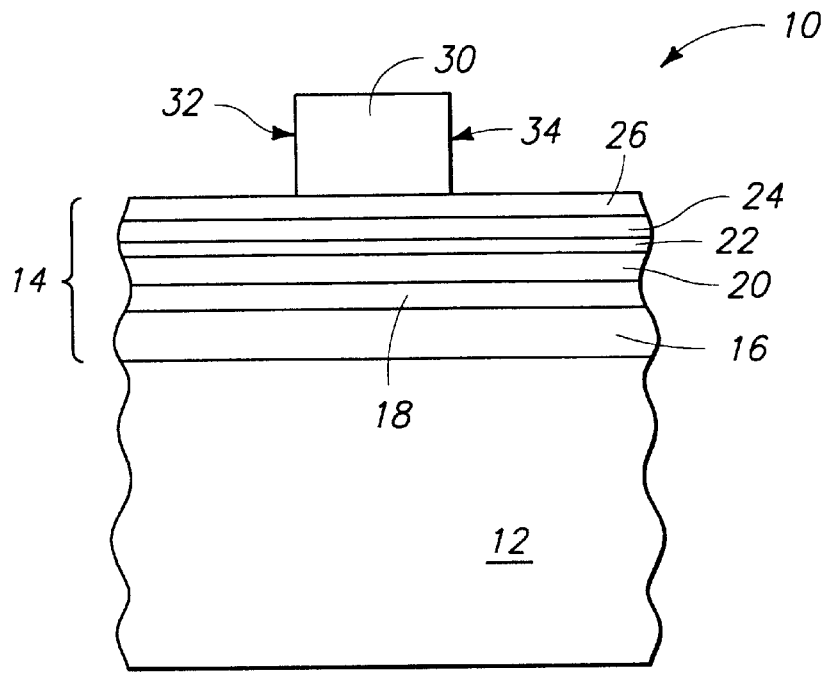
FIG. 1 is a diagrammatic, cross-sectional view of a semiconductor wafer fragment patterned in accordance with a prior art method of forming a magnetoresistive device.
Figure 3:
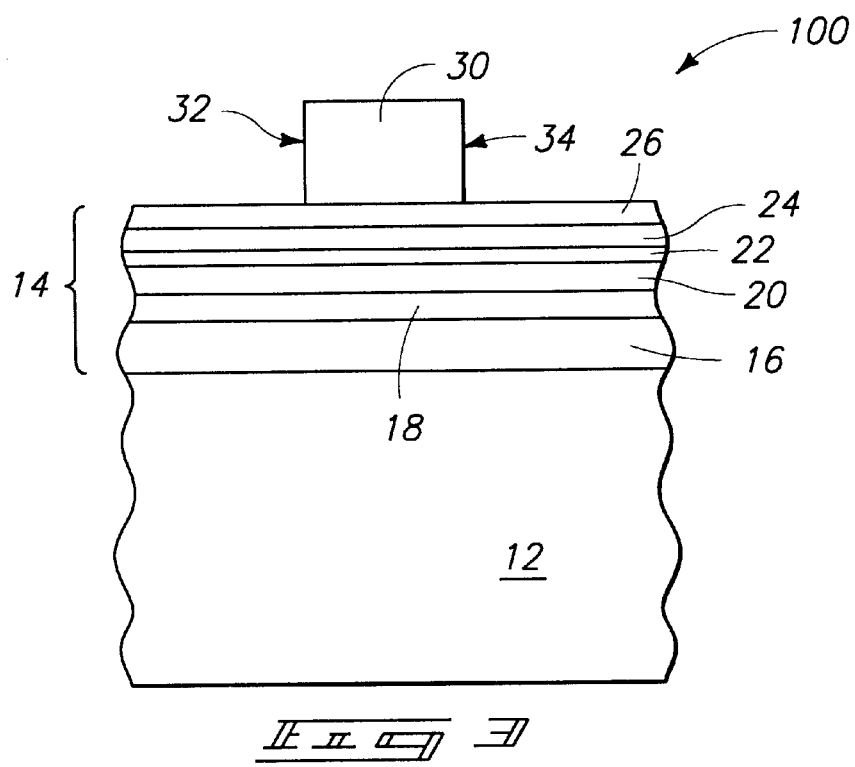
FIG. 3 is a diagrammatic, cross-sectional view of a semiconductor wafer fragment at a preliminary processing step of a method of the present invention.

A method of the present invention is described with reference to FIGS. 3–9. Referring initially to FIG. 3, a semiconductor wafer fragment 100 is illustrated at a preliminary processing step of a method of the present invention. Wafer fragment 100 comprises substrate 12, stack 14 and masking block 30 of the prior art fragment 10 described with reference to FIG. 1.

Figure 4:
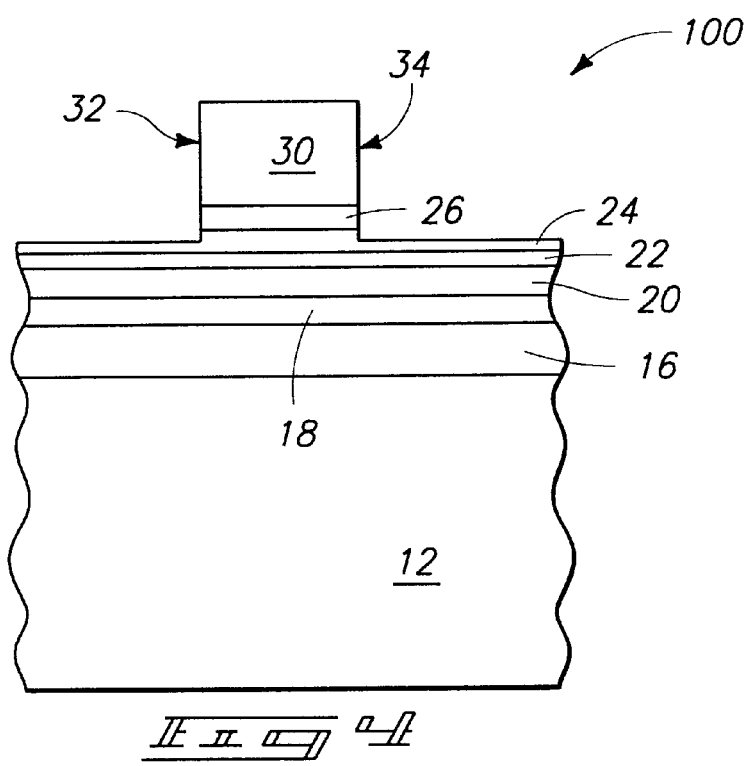
FIG. 4 is a view of the FIG. 3 wafer fragment shown at a processing step subsequent to that of FIG. 3.

Referring to FIG. 4, fragment 100 is subjected to a first etch utilizing, for example, either a reactive ion etch or an ion mill to extend the peripheral pattern of block 30 entirely through barrier layer 26 and partially into first magnetic material 24. During the etch of material 24, either or both of masking block 30 and barrier layer 26 can be considered to comprise a patterned mask, with such patterned mask defining a first pattern. The shown etching of material 24 extends the first pattern into the second magnetic layer 24, but not entirely through the second magnetic layer 24. Although the shown etch penetrates into material 24, it is to be understood that the invention encompasses other embodiments (not shown) wherein the etch extends through layer 26 and terminates at about an upper surface of material 24, rather than extending into material 24.

Referring to FIG. 5, a second etch is utilized to extend the first pattern of masking block 30 (FIG. 4) and barrier layer 26 entirely through magnetic material 24, and masking block 30 is removed. Masking block 30 can be removed before or after the shown etch through magnetic material 24. The etch utilized to extend the first pattern through material 24 is preferably selective for the magnetic material 24 relative to the non-magnetic material 22, or in other words, preferably removes material 24 at a rate faster than any removal of material 22. A preferred selectivity comprises removal of material 24 at a rate which is at least about 5 times faster than any removal of material 22. A suitable etch can comprise, for example, a wet etch comprising dilute nitric acid, with the term "dilute" referring to a nitric acid concentration of less than or equal to about 2%, by weight. The dilute nitric acid etch can be particularly effective in applications in which magnetic material 24 comprises nickel and iron, and in which material 22 comprises one or more of aluminum oxide, silicon dioxide, and silicon oxynitride.

The removal of material 24 exposes portions 102 of non-magnetic material 22.

The patterned material 24 comprises sidewall edges 104 comprising the first pattern defined by masking block 30 (FIG. 4). In an exemplary embodiment, material 24 is patterned into a circular or elliptical construction as shown in FIG. 6. More specifically, FIG. 6 illustrates that patterned materials 24 and 26 can comprise a plurality of separate circular blocks 110 extending across an upper surface of non-magnetic material 22. The circular outer peripheries of blocks 110 correspond to the pattern initially defined by masking block 30 (FIG. 4). A preferred shape of the outer peripheries of blocks 110 is an elliptical shape. Although blocks 110 are illustrated to comprise curved outer peripheries, it is to be understood that the blocks can be patterned into other shapes, such as, for example, rectangular shapes.

Figure 7:
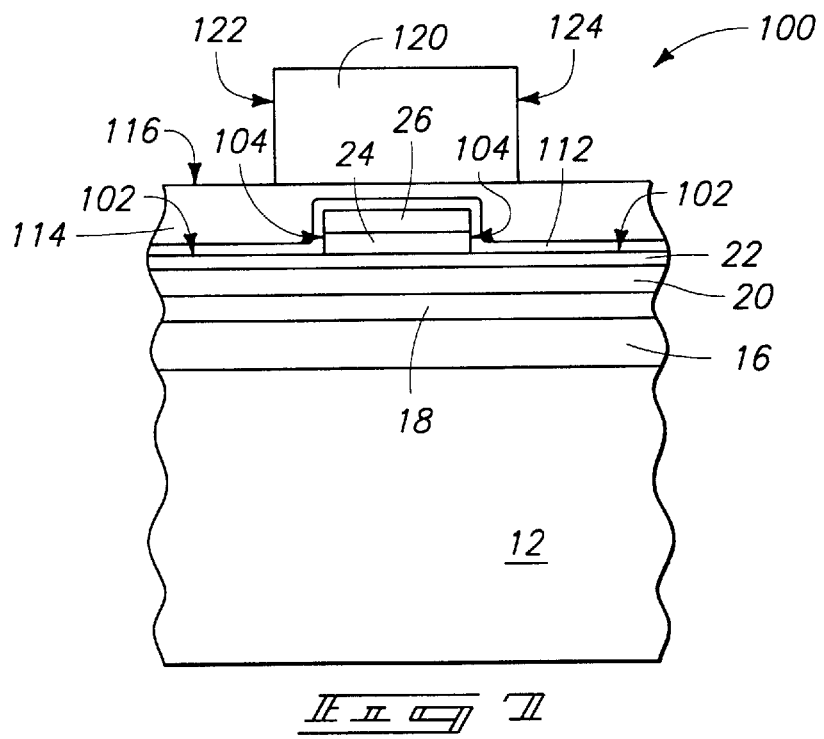
FIG. 7 is a cross-sectional view of the FIG. 3 wafer fragment shown at a processing step subsequent to that of FIG. 5.

FIG. 7 illustrates the construction 100 in the cross-sectional view of FIG. 5, and at a processing step subsequent to that of FIG. 5. Specifically, a protective layer 112 is formed over exposed portions 102 of non-magnetic material 22, as well as over barrier layer 26 and sidewall edges 104 of magnetic material 24. Protective layer 112 can comprise a dielectric material, such as, for example, silicon carbide and/or silicon nitride.

A mass 114 is formed over protective material 112. Mass 114 can comprise, for example, an insulative material, and in particular embodiments comprises an oxide of silicon, such as, for example, silicon dioxide or borophosphosilicate glass (BPSG). Mass 114 comprises an upper surface 116, and in the shown preferred embodiment such upper surface has been planarized. An exemplary process for planarizing an upper surface of mass 114 is chemical-mechanical polishing. The planarized surface 116 can provide a good base for subsequent formation of a patterned masking block 120 which is shown formed on mass 114. Block 120 can comprise photoresist, and can be patterned utilizing conventional photolithographic methods. Block 120 is patterned into a second pattern defined by peripheral outer edges 122 and 124, with such second pattern preferably being different than the first pattern defined by peripheral outer edges 32 and 34 of first masking block 30 (FIG. 3).

Figure 2:
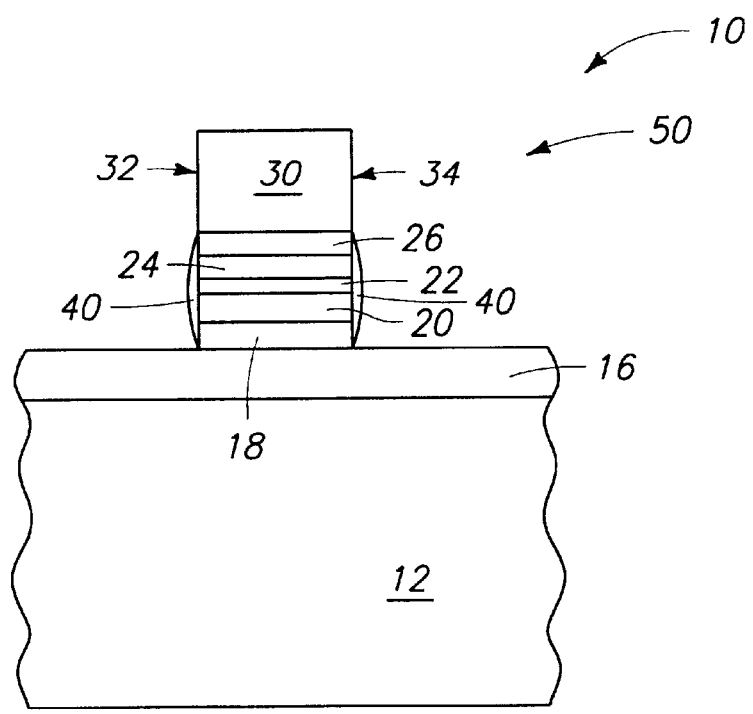
FIG. 2 is a view of the FIG. 1 wafer fragment shown at a processing step subsequent to that of FIG. 1 in accordance with a prior art processing method.
Figure 8:
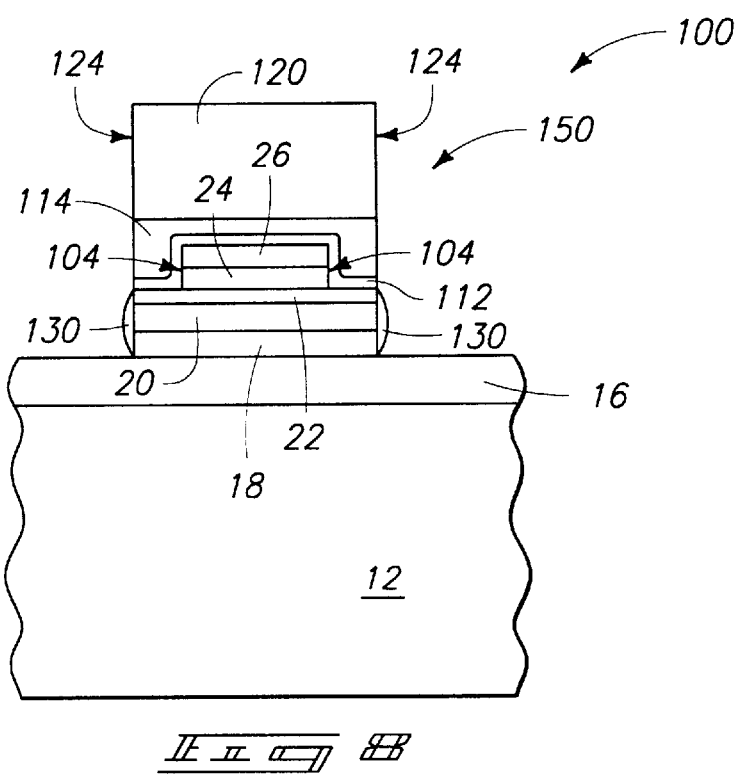
FIG. 8 is a view of the FIG. 3 wafer fragment shown at a processing step subsequent to that of FIG. 7.

Referring to FIG. 8, the second pattern from masking block 120 is transferred through mass 114, layer 112, and layers 22, 20 and 18 to form an MRAM construction 150. The patterning of mass 114 and layers 112, 22, 20 and 18 can be accomplished by, for example, a reactive ion etch, or ion milling. The etching can form a sputtered material 130 as a by-product, and some of the sputtered material can settle on sidewalls of layers 18, 20 and 22 as shown. However, the sputter-deposited material 130 does not contact both of layers 20 and 24, and accordingly the problem discussed above with reference to FIG. 2 does not exist. Specifically, even though sputtered material 130 can comprise magnetic material from layer 20, the sputtered material does not magnetically interconnect layers 20 and 24. An additional difference between the MRAM device 150 of FIG. 8 and the MRAM device 50 of FIG. 2 is that device 150 has layers 24 and 26 patterned into a different pattern that underlying layers 18,20, and 22.

Although a reactive ion etch can be utilized for patterning materials 114, 112, 22, 20 and 18, other etches can also be utilized for such patterning, including etches which are primarily chemical etches instead of primarily physical etching processes. For instance, if layers 112 and 114 comprise silicon dioxide, a fluorinated etchant, such as, for example, $CF_4$, can be utilized to etch through materials 114 and 112. If material 22 comprises aluminum oxide, a fluorinated etchant can also be utilized to etch through the aluminum oxide, and such fluorinated etchant can comprise, for example, one or both of $CF_4$ and $NF_3$. Further, the fluorinated etchant utilized to etch through layer 22 can be the same as that utilized to etch through materials 112 and 114. If magnetic layer 20 comprises nickel and iron, a chlorinated etchant can be utilized to etch through such layer, such as, for example, an etchant comprising $BCl_3$. Alternatively, a dilute nitric acid solution can be utilized to etch through the magnetic layer 20. Subsequent to the etching through magnetic layer 20, a chlorinated etchant can be utilized to etch through a tantalum-containing barrier layer 18, with a suitable chlorinated etchant comprising, for example, $BCl_3$.

In the shown embodiment, the etch extends entirely through layers 18, 20, and 22; but it is to be understood that the invention encompasses other embodiments wherein the etch extends through layer 22, only partially into layer 20, and not into layer 18; as well as embodiments wherein the etch extends through layers 20 and 22, but only partially into layer 18.

Figure 9:
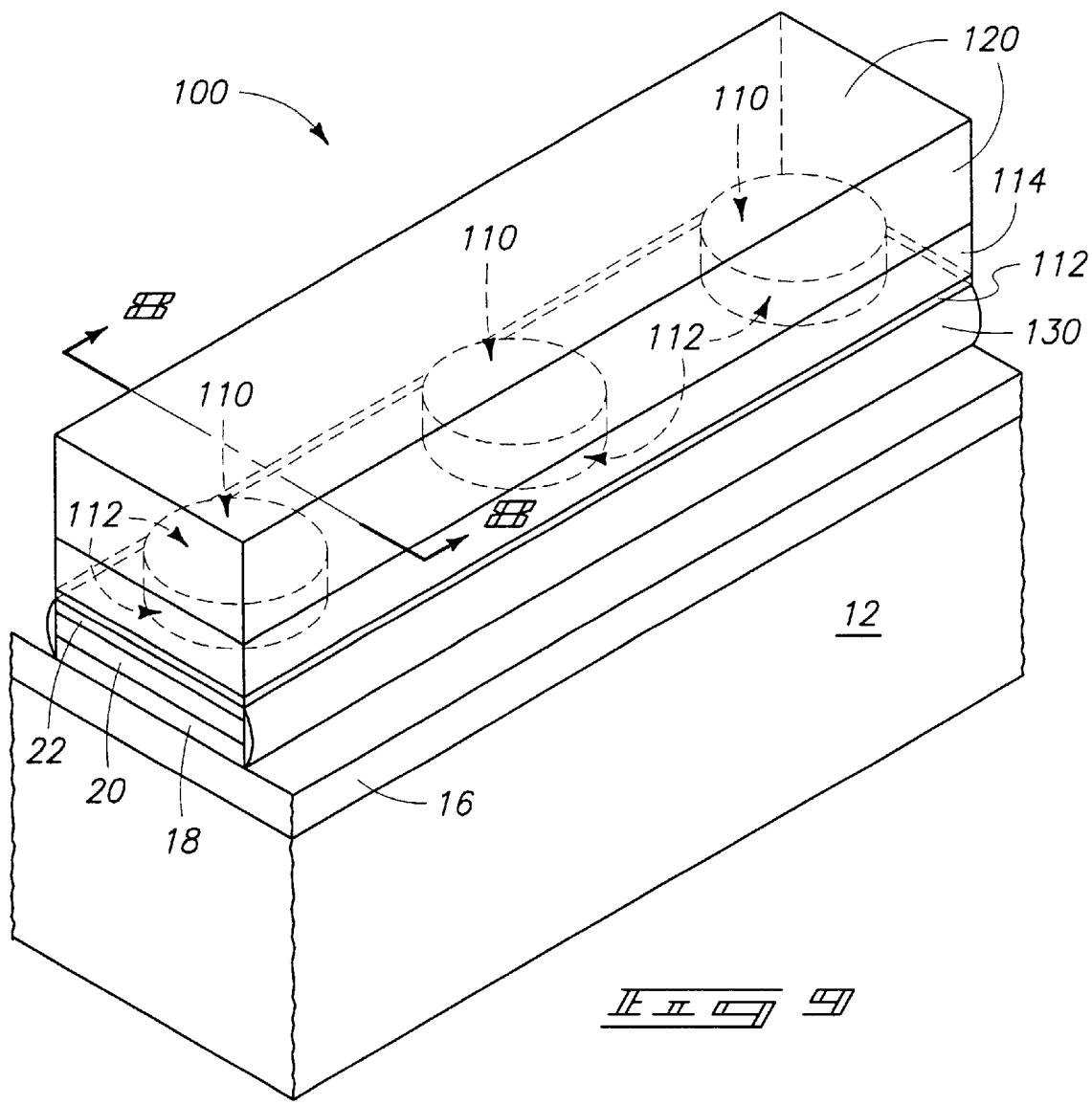
FIG. 9 is a isometric, diagrammatic view of a semiconductor wafer portion comprising the FIG. 8 cross-section. The FIG. 8 cross-section extends along the line 8—8 of FIG. 9.

FIG. 9 illustrates an isometric view of the wafer fragment 100 comprising the cross-section of FIG. 8. Such illustrates the second pattern defined by masking block 120. Further, patterned blocks 110 are illustrated in diagrammatic hidden-line view to illustrate an exemplary difference between the first pattern utilized to form blocks 110 and the second pattern utilized to pattern layers 18, 20 and 22. Masking block 120 can be removed in processing subsequent to that of FIG. 9 (not shown). Each of the blocks 110 together with the underlying materials 18, 20 and 22 can define a separate MRAM storage device. Conductive material 16 can be utilized for reading and writing to the separate devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a magnetoresistive device, comprising:

forming a construction which includes a first magnetic layer, a non-magnetic layer over the first magnetic layer, and a second magnetic layer over the non-magnetic layer; the second magnetic layer having an uppermost surface;

extending a first pattern through the second magnetic layer and to the non-magnetic layer with an etch selective for material of the second magnetic layer relative to material of the non-magnetic layer;

forming a dielectric material over the patterned second magnetic layer; the dielectric material extending over the uppermost surface of the second magnetic layer; and after forming the dielectric material and while the dielectric material remains over the uppermost surface of the second magnetic layer, utilizing an etching process to extend a second pattern through the non-magnetic layer and at least partway into the first magnetic layer.

2. The method of claim 1 wherein the second etching process comprises a primarily chemical etching process.

3. The method of claim 1 wherein the second pattern comprises a different peripheral shape than the first pattern.

4. The method of claim 1 wherein the etch selective for material of the second magnetic layer relative to material of the non-magnetic layer utilizes nitric acid.

5. The method of claim 1 wherein the non-magnetic layer comprises aluminum oxide, and wherein the etching process utilizes a fluorinated etchant to etch through the aluminum oxide and a chlorinated etchant to etch through the first magnetic layer.

6. The method of claim 1 wherein:
the first magnetic layer is formed over a tantalum-containing material;
the non-magnetic layer comprises aluminum oxide; and
the etching process utilizes a first fluorinated etchant to etch through the aluminum oxide, a chlorinated etchant to etch through the first magnetic layer, and a second fluorinated etchant to etch through the tantalum-containing material.

7. The method of claim 6 wherein the first and second fluorinated etchants comprise one or both of $CF_4$ and $NE_3$, and wherein the chlorinated etchant comprises $BCl_3$.

8. The method of claim 1 wherein the first and second magnetic layers comprise one or more of nickel, iron, cobalt, iridium and manganese.

9. The method of claim 1 wherein the first and second magnetic layers comprise identical chemical compositions to one another.

10. The method of claim 1 wherein the first and second magnetic layers comprise different chemical compositions relative to one another.

11. The method of claim 1 wherein the first and second magnetic layers are physically against the non-magnetic layer.

12. The method of claim 1 further comprising A method of forming a magnetoresistive device, comprising:
forming a construction which includes a first magnetic layer, a non-magnetic layer over the first magnetic layer, and a second magnetic layer over the non-magnetic layer;
extending a first pattern through the second magnetic layer and to the non-magnetic layer with an etch selective for material of the second magnetic layer relative to material of the non-magnetic layer;
forming a dielectric material over the patterned second magnetic layer;
forming a mass over the dielectric material and planarizing an upper surface of the mass prior to the second etch;

after forming the mass over the dielectric material and planarizing an upper surface of the mass, utilizing a second etch to extend a second pattern through the non-magnetic layer and at least partway into the first magnetic layer; and and wherein the second etch comprises forming a patterned masking block over the planarized upper surface of the mass and extending a pattern defined by the masking block through the non-magnetic layer and at least partway into the first magnetic layer.

13. The method of claim 1 wherein the second pattern extends entirely through the first magnetic layer.

14. The method of claim 1 wherein the non-magnetic layer comprises an electrically insulative material.

15. The method of claim 1 wherein the non-magnetic layer comprises aluminum oxide.

16. The method of claim 1 wherein the non-magnetic layer comprises silicon oxynitride.

17. The method of claim 1 wherein the non-magnetic layer comprises an electrically conductive material.

18. The method of claim 1 wherein the first pattern is defined by a patterned mask comprising a patterned tantalum-containing layer; and wherein the extending the first pattern through the second magnetic layer comprises etching the second magnetic layer with the etch selective for the material of the second magnetic layer while the patterned tantalum-containing layer is over the second magnetic layer.

19. A method of forming a magnetoresistive device, comprising:
forming a stack comprising a first magnetic layer, a second magnetic layer, and a non-magnetic layer between the first and second magnetic layers; the second magnetic layer having an uppermost surface;
forming a patterned mask over the second magnetic layer, the patterned mask defining a first pattern;
extending the first pattern into the second magnetic layer, but not entirely through the second magnetic layer, with a first etching process;
utilizing a second etching process, different than the first etching process, to extend the first pattern entirely through the second magnetic layer and to the non-magnetic layer, the second etching process being selective for material of the second magnetic layer relative to material of the non-magnetic layer;
forming a dielectric material over the patterned second magnetic layer; the dielectric material extending over the uppermost surface of the second magnetic layer; and
while the dielectric material remains over the uppermost surface of the second magnetic layer, utilizing a third etching process to extend a second pattern through the dielectric material, non-magnetic layer and first magnetic layer.

20. The method of claim 19 wherein the non-magnetic layer comprises an electrically insulative material.

21. The method of claim 19 wherein the non-magnetic layer comprises aluminum oxide.

22. The method of claim 19 wherein the non-magnetic layer comprises silicon oxynitride.

23. The method of claim 19 wherein the non-magnetic layer comprises an electrically conductive material.

24. The method of claim 19 wherein the patterned mask comprises tantalum.

25. The method of claim 19 wherein the patterned mask comprises tantalum nitride.

26. The method of claim 19 wherein the second pattern is different from the first pattern.

27. The method of claim 19 wherein the dielectric material comprises one or both of silicon carbide and silicon nitride.

28. The method of claim 19 wherein the dielectric material comprises silicon carbide.

29. The method of claim 19 wherein the dielectric material comprises silicon nitride.

30. A method of forming a magnetoresistive device, comprising:

forming a stack comprising a first magnetic layer, a second magnetic layer, and a non-magnetic layer between the first and second magnetic layers;

forming a patterned mask over the second magnetic layer, the patterned mask defining a first pattern;

extending the first pattern into the second magnetic layer, but not entirely through the second magnetic layer, with a first etching process;

utilizing a second etching process, different than the first etching process, to extend the first Pattern entirely through the second magnetic layer and to the non-magnetic layer, the second etching process being selective for material of the second magnetic layer relative to material of the non-magnetic layer;

forming a dielectric material over the Patterned second magnetic layer;

forming an insulative material over the dielectric material;

planarizing a surface of the insulative material;

forming a patterned masking block over the planarized surface; the patterned masking block defining a second pattern; and utilizing a third etching process to extend the second Pattern through the insulative material, dielectric material, non-magnetic layer and first magnetic layer.

31. The method of claim 30 wherein the insulative material comprises an oxide of silicon.

32. A method of forming a magnetoresistive device, comprising:

forming a construction which includes a first tantalum-containing layer, a first magnetic layer over the first tantalum-containing layer, a non-magnetic layer over the first magnetic layer, a second magnetic layer over the non-magnetic layer, and a second tantalum-containing layer over the second magnetic layer;

forming a first patterned masking block over the second tantalum-containing layer, the first patterned masking block defining a first pattern having a first peripheral shape;

etching the second tantalum-containing layer and a portion of the second magnetic layer with a primarily physical etch to transfer the first peripheral shape to the second tantalum-containing layer and the portion of the second magnetic layer;

after the etching with primarily physical etch, extending the first peripheral shape entirely through the second magnetic layer with a wet etch selective for the second magnetic layer relative to the non-magnetic layer; the wet etch exposing portions of the non-magnetic layer;

forming a dielectric material over the etched second tantalum-containing layer, etched second magnetic layer, and exposed portions of the non-magnetic layer;

after forming the dielectric material, forming a mass over the dielectric material and planarizing an upper surface of the mass;

forming a second patterned masking block over the mass, the second patterned masking block defining a second pattern having a second peripheral shape, the second peripheral shape being different than the first peripheral shape; and utilizing a third etching process to extend the second pattern through the non-magnetic layer, first magnetic layer and first tantalum-containing layer.

33. The method of claim 32 wherein the dielectric material comprises one or both of silicon carbide and silicon nitride.

34. The method of claim 32 wherein the first and second magnetic layers comprise one or more of nickel, iron, cobalt, iridium and manganese.

35. The method of claim 32 wherein the first and second magnetic layers comprise identical chemical compositions to one another.

36. The method of claim 32 wherein the first and second magnet layers comprise different chemical compositions relative to one another.

37. The method of claim 32 wherein the non-magnet layer comprises an electrically insulative material.

38. The method of claim 32 wherein the non-magnet layer comprises aluminum oxide.

39. The method of claim 32 wherein the non-magnetic layer comprises silicon oxynitride.

40. The method of claim 32 wherein the non-magnet layer comprises an electrically conductive material.

41. The method of claim 32 wherein the primarily physical etch comprises either a reactive ion etch or ion milling.

42. The method of claim 32 wherein:

the non-magnetic layer comprises aluminum oxide; and the third etching process utilizes a first fluorinated etchant to etch through the aluminum oxide, a chlorinated etchant to etch through the first magnetic layer, and a second fluorinated etchant to etch through the tantalum-containing material.

43. The method of claim 42 wherein the first and second fluorinated etchants comprise one or more of $CF_4$ and $NF_3$, and wherein the chlorinated etchant comprises $BCl_3$.

* * * * *

UNITED STATES PATENT AND TRADEMARK OFFICE
CERTIFICATE OF CORRECTION

PATENT NO. : 6,656,372 B2
DATED : December 2, 2003
INVENTOR(S) : Donald L. Yates It is certified that error appears in the above-identified patent and that said Letters Patent is hereby corrected as shown below:

Column 6,
Line 10, replace "and 26 patterned into a different pattern that underlying" with -- and 26 patterned into a different pattern than underlying --

Column 7,
Lines 39-40, replace "and $NE_3$, and wherein the chlorinated etchant comprises $BCI_3$" with -- and $NF_3$, and wherein the chlorinated etchant comprises $BCI_3$ --
Line 53, delete "The method of claim 1 further comprising"

Column 9,
Line 19, replace "etching process, to extend the first Pattern entirely" with -- etching process, to extend the first pattern entirely --
Line 25, replace "forming a dielectric material over the Patterned second" with -- forming a dielectric material over the patterned second --
Line 33, replace "Pattern through the insulative material, dielectric" with -- pattern through the insulative material, dielectric --

Column 10,
Line 31, replace "magnet layers comprise different chemical compositions" with -- magnetic layers comprise different chemical compositions --
Lines 33, 35 and 39, replace "The method of claim 32 wherein the non-magnet layer" with -- The method of claim 32 wherein the non-magnetic layer --
Line 52, replace "and wherein the chlorinated etchant comprises $BCI_3$." with -- and wherein the chlorinated etchant comprises $BCI_3$. --

Signed and Sealed this

Seventeenth Day of August, 2004

JON W. DUDAS
*Acting Director of the United States Patent and Trademark Office*